United States Patent
Hamaguchi (10) Patent No.: US 6,862,213 B2
(45) Date of Patent: Mar. 1, 2005

(54) SEMICONDUCTOR MEMORY DEVICE AND CONTROL METHOD THEREOF

(75) Inventor: Koji Hamaguchi, Nara (JP)

(73) Assignee: Sharp Kabushiki Kaisha, Abeno-ku (JP)

(*) Notice: Subject to any disclaimer, the term of this patent is extended or adjusted under 35 U.S.C. 154(b) by 0 days.

(21) Appl. No.: 10/702,790

(22) Filed: Nov. 5, 2003

(65) Prior Publication Data

US 2004/0130938 A1 Jul. 8, 2004

(30) Foreign Application Priority Data

Nov. 7, 2002 (JP) ........................................ 2002-324329

(51) Int. Cl.⁷ .............................................. G11C 11/00
(52) U.S. Cl. ...................................... 365/158; 365/148
(58) Field of Search ................................. 365/158, 148

(56) References Cited

U.S. PATENT DOCUMENTS

| | | | |
|---|---|---|---|
| 5,694,366 A | * 12/1997 | Chevallier et al. | 365/207 |
| 5,883,827 A | 3/1999 | Morgan | 365/100 |
| 6,134,141 A | 10/2000 | Wong | 365/185.03 |
| 6,259,627 B1 | 7/2001 | Wong | 365/185.21 |
| 2002/0015323 A1 | 2/2002 | Maruyama | |

OTHER PUBLICATIONS

European Search Report mailed on Feb. 3, 2004, for EP patent application No. EP 03 256 662, two pages.

* cited by examiner

Primary Examiner—M. Tran
(74) Attorney, Agent, or Firm—Morrison & Foerster LLP (57) ABSTRACT

A semiconductor memory device comprises a memory cell formed of a nonvolatile resistance variable memory device in which a resistance value is variable according to the application of electrical stress, and a selection transistor; and word-line-voltage feeding means that feeds a word line voltage to a word line to be coupled to the memory cell. When executing a program operation for the memory cell and a verify operation for verifying a program state of the memory cell, the word-line-voltage feeding means feeds the word line voltage of the same voltage level to the word line to be coupled to the memory cell selected as a program target for two operations set as mutually related front and rear steps, namely, a program operation to be executed for the memory cell and a verify operation to be executed to verify a program state of the memory cell.

9 Claims, 6 Drawing Sheets

SEMICONDUCTOR MEMORY DEVICE AND CONTROL METHOD THEREOF

BACKGROUND OF THE INVENTION

1. Field of the Invention

The present invention relates to a semiconductor memory device that performs a memory-cell program operation and a verify operation for verifying a memory-cell program state and to a control method for the program and verify operations.

2. Description of the Related Art

By way of an example of conventional semiconductor memory devices, a NOR-type flash memory device and an operation method for the memory device will be described hereinbelow with reference to FIGS. 4 to 6.

Figure 4:
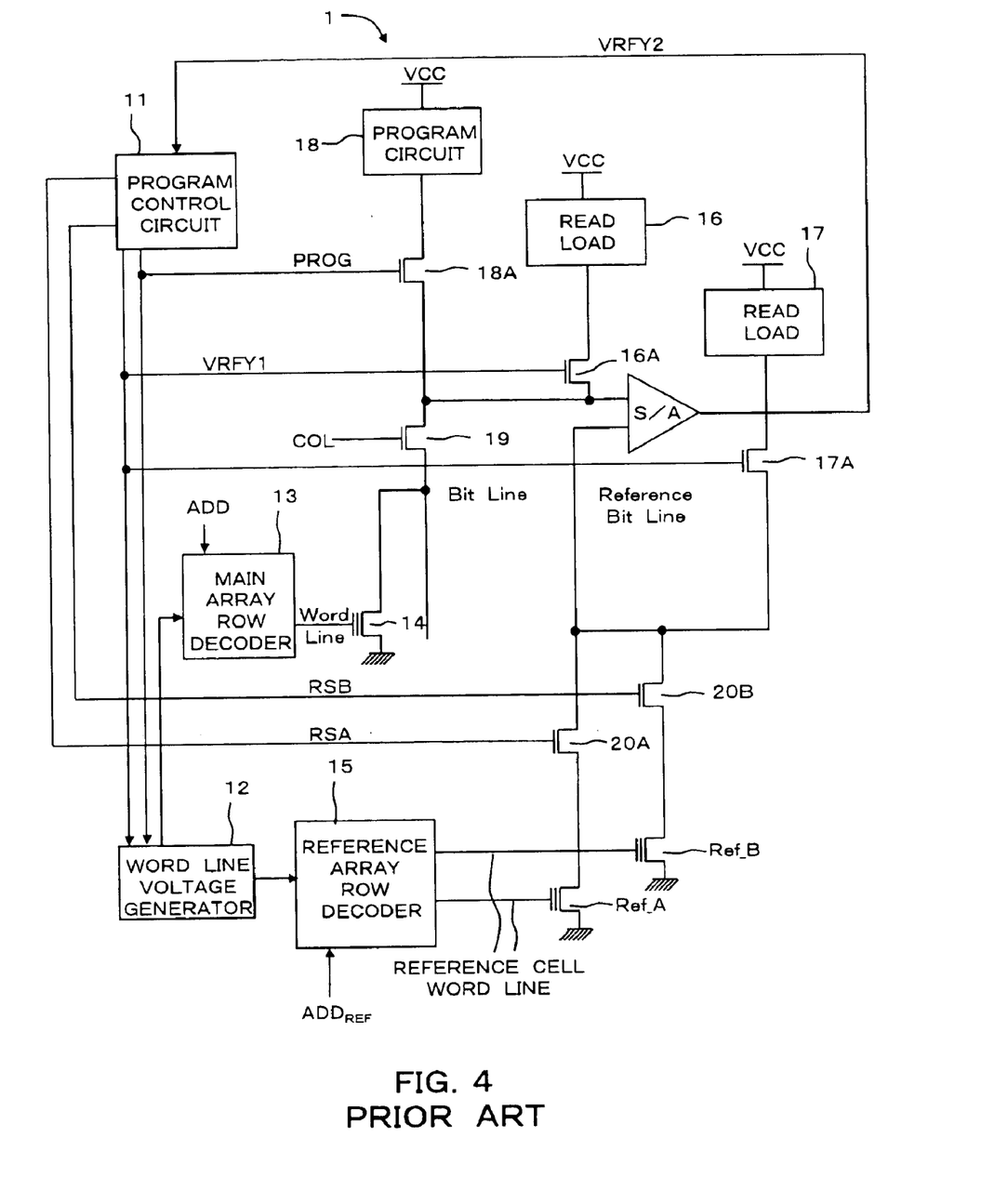
FIG. 4 is a circuit diagram showing example major configuration portions of a conventional (prior art) NOR flash memory.
Figure 5:
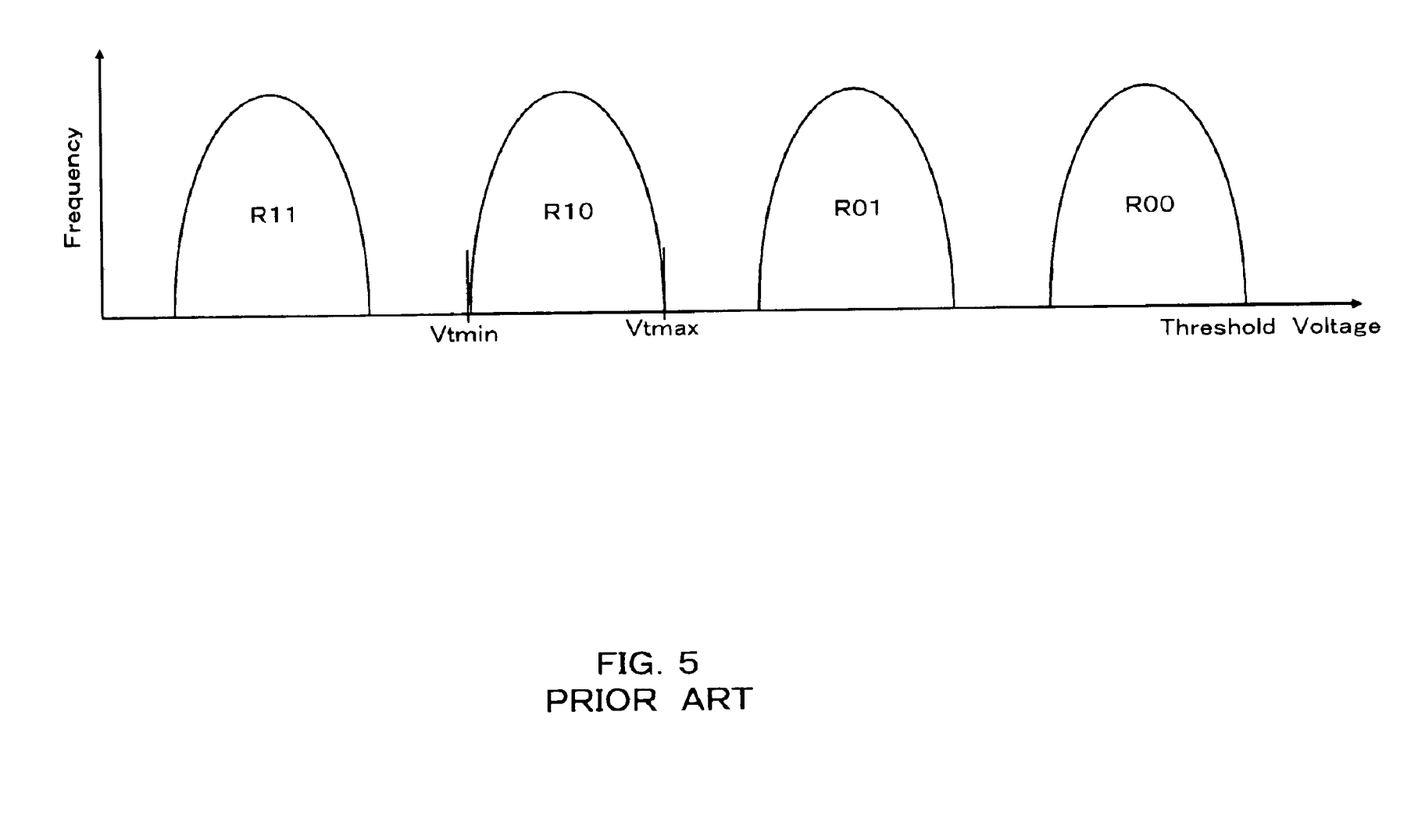
FIG. 5 is a diagram of a threshold value distribution of the NOR flash memory device that stores two bits (four levels) into one cell.

FIG. 4 is a circuit diagram showing an example of a major portion configuration of a conventional NOR flash memory device 1. FIG. 5 shows a diagram of a threshold voltage distribution in the NOR flash memory device 1 capable of storing two bits per cell.

Referring to FIG. 4, the NOR flash memory device 1 has a program control circuit 11; a word line voltage generator 12; a main array row decoder 13; a plurality of main cells 14 (only one of which is shown for simplicity); a reference cell row decoder 15; a reference cell RefA of a reference of a referential threshold voltage (minimum set value $Vt_{min}$); a reference cell RefB of a referential threshold voltage (maximum set value $Vt_{max}$); a determination-dedicated sense amplifier S/A; a main-cell read load 16; a reference-cell dedicated read load 17; a program circuit 18; and a switch devices 16A, 17A, 18A, 19, 20A, and 20B. The plurality of main cells 14 are configured in the form of a flash cell array formed of a plurality of floating-gate transistors.

The program control circuit 11 controls and/or performs processing as described hereunder. In the event of the execution of a verify operation, the program control circuit 11 outputs a verify execution signal VRFY1 to the word line voltage generator 12 and switch devices 16A and 17A. Concurrently, the program control circuit 11 outputs a reference-cell selection signal RSA (or RSB) to the reference cell RefA (or Ref B). Further, for the execution of a program operation, the program control circuit 11 outputs a program execution signal PROG to the word line voltage generator 12 and the switch device 18A.

In more detail, the program control circuit 11 controls and/or performs the processing as described hereunder. In accordance with a verify determination signal VRFY2 received from the sense amplifier S/A, a program pulse is applied from the program circuit 18 to a selected main cell 14, the processing executes a verify operation. Then, the processing determines whether the threshold voltage of the main cell 14 is higher than or equal to the threshold voltage $Vt_{min}$ of the reference cell RefA. If the processing determines that the threshold voltage of the main cell 14 is lower than the threshold voltage $Vt_{min}$, the processing returns to the step of programming (reprogramming). On the other hand, as the determination result, if the threshold voltage is higher than or equal to the threshold voltage $Vt_{min}$, the processing determines whether the threshold voltage of the main cell 14 is lower than or equal to the threshold voltage $Vt_{max}$ of the other reference cell RefB. (In this step, the processing switches from the reference-cell selection signal RSA to the reference-cell selection signal RSB). If the threshold voltage of the main cell 14 is lower than or equal to the threshold voltage $Vt_{max}$ of the reference cell RefB, the processing executes a normal program termination. On the other hand, if the threshold voltage is not lower than or equal to the threshold voltage $Vt_{max}$ of the reference cell RefB, the processing executes a forced program termination process (causes program failure).

Upon receipt of the program execution signal PROG from the program control circuit 11, the word line voltage generator 12 outputs a programming voltage the main array row decoder 13 and the reference cell row decoder 15. In addition, upon receipt of the verify execution signal VRFY1 from the program control circuit 11, the word line voltage generator 12 outputs a verify voltage to the main array row decoder 13 and the reference cell row decoder 15.

The main array row decoder 13 decodes an input address signal ADD. Corresponding to a given address, the main array row decoder 13 outputs a verify voltage or a programming voltage to a to-be-selected main array word line, and selects a predetermined main cell 14. Thus, the main array row decoder 13 has not only the function of decoding an address signal, but also a driver function for feeding a word line voltage (i.e., the verify voltage or the programming voltage in the present case) generated in the word line voltage generator 12. Similarly, a column decoder (not shown) decodes an input address signal ADD and outputs a column section signal COL to thereby select a predetermined to-be-selected bit line corresponding to a given address.

The reference cell row decoder 15 is responsible of decoding an input reference address signal $ADD_{REF}$ to output a verify voltage to a reference-cell dedicated word line and then to select a predetermined reference cell RefA or reference cell RefB. Thus, the reference cell row decoder 15 has not only the function of decoding the reference address signal $ADD_{REF}$, but also a driver function for feeding a word line voltage (i.e., the verify voltage or the programming voltage in the present case) generated in the word line voltage generator 12.

For execution of the verify operation, the sense amplifier S/A performs a comparison and a determination whether the threshold voltage of the selected main cell 14 is higher than or equal to the threshold voltage $Vt_{min}$ of the reference cell RefA. Then, the sense amplifier S/A outputs the verify determination signal VRFY2 as a resultant signal to the program control circuit 11.

While only the two reference cells RefA and RefB are shown in FIG. 4, other reference cells need to be provided corresponding to other memory states. In addition, the configuration shown in FIG. 4 uses the reference cell row decoder 15 to individually select the reference cells RefA and RefB. However, since columns (reference bit lines) are individually selectable by the reference-cell selection signals RSA and RSB, no problems occur even with a word line provided to common for the reference cells RefA and RefB.

Figure 6:
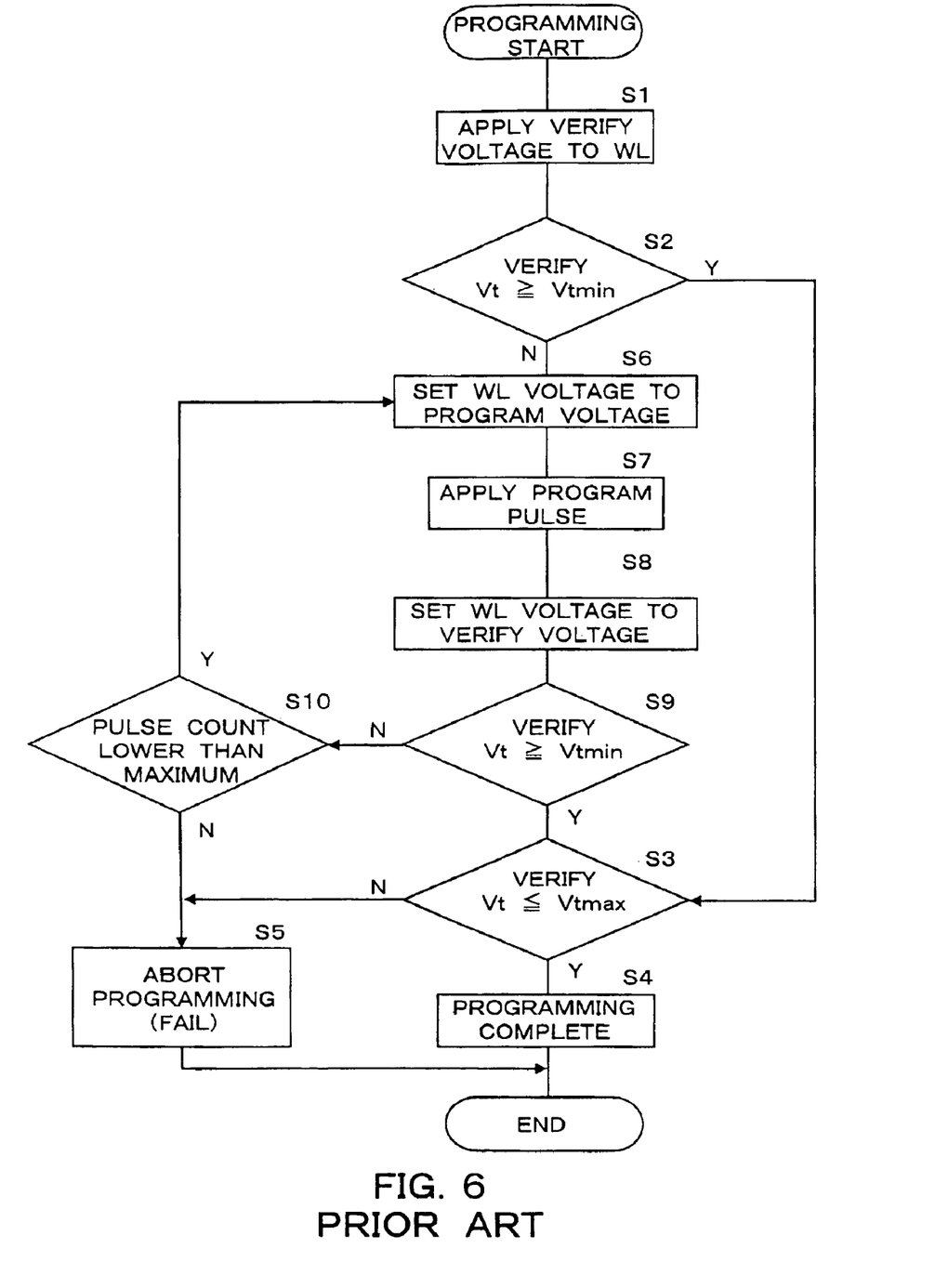
FIG. 6 is a flowchart showing program and verify operations in the conventional NOR flash memory.

Referring to FIG. 6, a description will now be made hereunder regarding general routines of the program and verify operations to be performed in the conventional NOR flash memory device constructed as described above.

FIG. 6 is a flowchart showing the program and verify operations to be performed in the NOR flash memory device 1 shown in FIG. 4. Hereinbelow, the verb "program" is defined to refer to executing processing that increases the threshold voltage of the flash cell, which works as a "storage cell," by storing electrons in the floating gate of the main cell 14.

First, in step S1, the program control circuit 11 outputs a verify execution signal VRFY1 to the word line voltage generator 12. The word line voltage generator 12, in turn, outputs a verify voltage (of about 5 volts (V)) to the main array row decoder 13 and the reference cell row decoder 15. Then, the main array row decoder 13 and reference cell row decoder 15 set the individual word line voltages of the main cell 14 and the reference cell RefA to the verify voltage (of about 5V).

At step S2, the processing executes a verify operation. The sense amplifier S/A compares the values of currents flowing to two input terminals thereof. Thereby, the sense amplifier S/A compares the threshold voltage of the main cell 14 and the threshold voltage $Vt_{min}$ of the reference cell RefA, and outputs the comparison result (verify determination signal VRFY2) to the program control circuit 11. In response to the signal VRFY2, the program control circuit 11 determines whether the threshold voltage of the main cell 14 is higher than or equal to the threshold voltage $Vt_{min}$ of the reference cell RefA.

In step S2, if the threshold voltage of the main cell 14 is determined to be higher than or equal to the threshold voltage $Vt_{min}$ of the reference cell RefA (if the answer is "Yes"), the processing jumps to the process of step S3. In step S3, the processing determines whether the threshold voltage of the main cell 14 is lower than or equal to the threshold voltage $Vt_{max}$ of the reference cell RefB. If in step S2 the threshold voltage of the main cell 14 is higher than or equal to the threshold voltage $Vt_{min}$ of the reference cell RefA and, concurrently, in step S3 the threshold voltage of the main cell 14 is lower than or equal to the threshold voltage $Vt_{max}$ of the reference cell RefB (if the answer is "Yes"), the processing executes a normal program termination (completes the program). However, if in step S2 the threshold voltage of the main cell 14 is higher than or equal to the threshold voltage $Vt_{min}$ of the reference cell RefA and, concurrently, in step S3 the threshold voltage of the main cell 14 is not lower than or equal to the threshold voltage $Vt_{max}$ of the reference cell RefB (if the answer is "No"), the processing executes a forced program termination in step S5 (causes the processing to fail).

In contrast, if in step S2 the threshold voltage of the main cell 14 is not higher than or equal to the threshold voltage $Vt_{min}$ of the reference cell RefA (if the answer is "No"), the processing proceeds to the subsequent process of step S6. In step S6, the program control circuit 11 outputs a program execution signal PROG to the word line voltage generator 12. In turn, the word line voltage generator 12 outputs a programming voltage (of about 6 to 10 V) to the main array row decoder 13, and the main array row decoder 13 sets the word line voltage of the main cell 14 to the programming voltage (of about 6 to 10 V). In the flash memory, since the threshold voltage of the flash cell (main cell 14) is determined in accordance with the word line voltage for programming, the threshold voltage desired to be set has to be altered.

Subsequently, at step S7, a program pulse voltage, of, for example, 5 V to 6V, is applied from the program circuit 18 only for a 0.5 to 1 µs. (program time) to the drain of the floating-gate transistor of the main cell 14.

At step S8, the word line voltage is altered from the programming voltage (of about 6 to 10 V) to a verify voltage (of about 5 V).

At step S9, a verify operation is executed to determine whether the threshold voltage of the flash cell (main cell 14) is higher than or equal to the threshold voltage $Vt_{min}$ of the reference cell RefA. If at step S9 the threshold voltage is higher than or equal to the threshold voltage $Vt_{min}$ (if the answer is "Yes"), the processing determines at the subsequent step S4 whether the threshold voltage of the flash cell is lower than or equal to the threshold voltage $Vt_{max}$. If at step S9 the threshold value is higher than or equal to the threshold voltage $Vt_{min}$, and concurrently if at step S3 the threshold voltage is lower than or equal to the threshold voltage $Vt_{max}$ (if the answer is "Yes"), the processing goes to step S4 to execute a normal program termination (completes the program processing). On the other hand, if at step S9 the threshold voltage of the flash cell is higher than or equal to the threshold voltage $Vt_{min}$, and concurrently if at step S3 the threshold voltage is not lower than or equal to the threshold voltage $Vt_{max}$ (if the answer is "No"), the processing proceeds to step S5 to execute a force program termination process (causes program failure).

In contrast, if at step S9 a verify operation is executed and the threshold value of the flash cell (main cell 14) is determined to be not higher than or equal to the threshold voltage $Vt_{min}$ (if the answer is "No"), at step S10 the processing counts the number of executions (execution counts) of the program-pulse application routine. If the count value is less than the value of a preset maximum set count (if the answer is "Yes"), the processing returns to the process of step S6 to reperform a program-pulse application process. On the other hand, if the count value has reached the value of the preset maximum set count (if the answer is "No"), the processing executes a forced program termination process (causes program failure) to prevent the program routine from entering an endless loop at step S5.

In the processes of the individual steps, no problems occur even without steps S1 and S2 being carried out in the case of a binary memory. However, in the case of a multi-level memory, the steps S1 and S2 are indispensable to prevent a state variation from being caused by over-programming. In addition, with a binary memory, the processing need not be performed in step S3 to determine whether the threshold voltage of the flash cell is lower than or equal to threshold voltage $Vt_{max}$. In addition, as described above, the processing of step S10 is performed to prevent the program routine to enter an endless loop when the selected main cell 14 cannot be programmed or cannot easily be programmed for some reasons.

In the conventional NOR flash memory, the word line voltage is altered corresponding to the state of memory operation at the times of the program pulse application and the program verify execution. This requires voltage control to be performed by providing the word line voltage generator 12 to alter the word line voltage corresponding to the memory operation state.

The voltage control is particularly complex in the case of a multi-level memory. In the case of a flash memory, a high voltage of 6 to 10 V is used for the word line voltage. When such a high voltage is altered, a long time (several hundred ns to several µs) is required after the voltage starts transition until it becomes stabilized. Consequently, problems arise in that the circuit area needs to be increased to meet the circuit size, and delay takes place in time of the program operation. Especially, in the case of a multi-level memory, these problems become more conspicuous as the per-cell information volume increases.

SUMMARY OF THE INVENTION

The present invention is proposed in view of the problems. Accordingly, a first object of the present invention is to provide a semiconductor memory device that enables at least the processing speeds of program and verify operation to be improved and that enables, for example, reduction in the chip area and electric current consumption for the program operation. A second object of the invention is to provide a control method for the semiconductor memory device mentioned above.

To achieve the first object, a semiconductor memory device of the invention comprises a memory cell formed of a nonvolatile resistance variable memory device in which a resistance value is variable according to the application of electrical stress, and a selection transistor; and word-line-voltage feeding means that feeds a word line voltage to a word line to be coupled to the memory cell, wherein the word-line-voltage feeding means feeds the word line voltage of the same voltage level to the word line to be coupled to the memory cell selected as a program target for two operations set as mutually related front and rear steps, namely, a program operation to be executed for the memory cell and a verify operation to be executed verify a program state of the memory cell.

According to the semiconductor memory device of the invention, a comparison is made between the values of currents flowing to a predetermined main cell and a reference cell that are selected by selecting a word line and a bit line corresponding to an input address to thereby implement at least a verify operation of two verify and program operations. To implement the operation, the main cell is configured of the nonvolatile variable resistor element and the selection transistor. In addition, the voltage to be applied to the word line of the main cell is set to the same voltage in the verify operation and the program operation.

Preferably, in the semiconductor memory device of the invention, a plurality of the memory cells are arranged individually in a row direction and a column direction to form a memory cell array; the memory cell has a plurality of the word lines and a plurality of bit lines; the word lines are commonly coupled to the plurality of memory cells along the row direction; and the bit lines are commonly coupled to the plurality of memory cells along the column direction.

The semiconductor memory device of the invention is preferably such that the memory cell is constructed of a serial circuit formed of the nonvolatile resistance variable memory device and the selection transistor; and the word line is coupled to a gate of the selection transistor; and the bit line is coupled to one end of the serial circuit.

In the semiconductor memory device of the invention, the verify operation is preferably executed by comparing values of currents flowing to the memory cell and a reference cell, the memory cell being coupled to the word line and the bit line that are selected corresponding to an input address.

It is further preferable that, in the semiconductor memory device of the invention, the program operation be executed such that using the word line voltage applied to the word line selected corresponding to the input address, the selection transistor in the memory cell selected as the program target is switched to an on-state; and a program pulse is then applied to the nonvolatile resistance variable memory device of the memory cell selected as the program target, via the bit line selected corresponding to the input address.

Furthermore, in the semiconductor memory device of the invention, the nonvolatile resistance variable memory device preferably becomes capable of storing multi-level data in the manner that the resistance state thereof is altered corresponding to the state of application of the program pulse.

In order to achieve the second object described above, a control method of the semiconductor memory device according to the invention comprises selecting the word line that is to be coupled to the memory cell selected as the program target, corresponding to the input address; setting the word line voltage of the selected word line to a verify voltage; subsequently executing the verify operation; and executing the program operation in continuation to the verify operation without altering the word line voltage.

In the control method of the semiconductor memory device according to the invention, a verify operation is preferably executed in continuation to the program operation without altering the program operation.

In order to achieve the object described above, the invention also provides a control method of the semiconductor memory device according to the invention comprises selecting the word line that is to be coupled to the memory cell selected as the program target, corresponding to the input address; setting the word line voltage of the selected word line to a program operation; subsequently executing the program operation; and executing the verify operation in continuation to the program operation without altering the word line voltage.

According to the present invention, the memory cell is a 1T1R (1 transistor, 1 resistor) memory cell configured of the nonvolatile resistance variable memory device and the selection transistor. In more detail, the memory cell is configured of the serial circuit constructed of the nonvolatile resistance variable memory device and the selection transistor. The nonvolatile resistance variable memory device is constructed of a nonvolatile variable resistor element that enables multi-level data to be stored in the manner that the resistance state thereof is altered corresponding to the voltage applied via the bit line. The word line is coupled to the gate of the selection transistor, thereby enabling the conductive state of the selection transistor to be controlled. The bit line is arranged to be coupled to the one end of the serial circuit so that the programming voltage can be applied to the nonvolatile resistance variable memory device. The word line voltage of the memory cell can be controlled to be the same for implementing the verify operation and the program operation. The word line to be coupled to the memory cell is adapted only to the selection operation of the selection transistor provided for the selection of the element. As such, dissimilar to the case of a flash memory, the resistance state of the memory device is not variable depending on the variation in the voltage value of the word line voltage. The use of principles as described above enables obtaining the control method of the invention for the semiconductor memory, which controls the word line voltage to a predetermined voltage for implementing the program operation and the verify operation.

According to the above, the time for switching from the program operation to the verify operation can be reduced corresponding to the fact that the word line voltage is not altered. Similarly, the time for switch from the verify operation to reprogram operation can be reduced. Consequently, the total time required for the overall program operation including the verify operation can be reduced. In addition, since the word line voltage is not altered, the word line voltage generator and the selection circuitry can either be omitted or be simplified. Thereby, the chip area can be reduced. Further, according to the omission or simplification of those circuits, the operation currents of those circuits can be eliminated from the chip operation current for the program operation. These advantages can be exhibited even more significantly in a complex memory as a multi-level memory that is required to perform a large number of verify operations.

In the nonvolatile variable resistor element, a thin film is formed between electrodes, and the thin film is formed of an oxide having a perovskite structure, such as $Pr_{0.7}Ca_{0.3}MnO_3$, containing manganese. The element thus formed is a nonvolatile memory material, in which with voltage being applied between electrodes, the resistance value is varied.

DETAILED DESCRIPTION OF THE INVENTION

An embodiment of a semiconductor memory device according to the present invention will be described hereinbelow with reference to the accompanying drawings.

Figure 1:
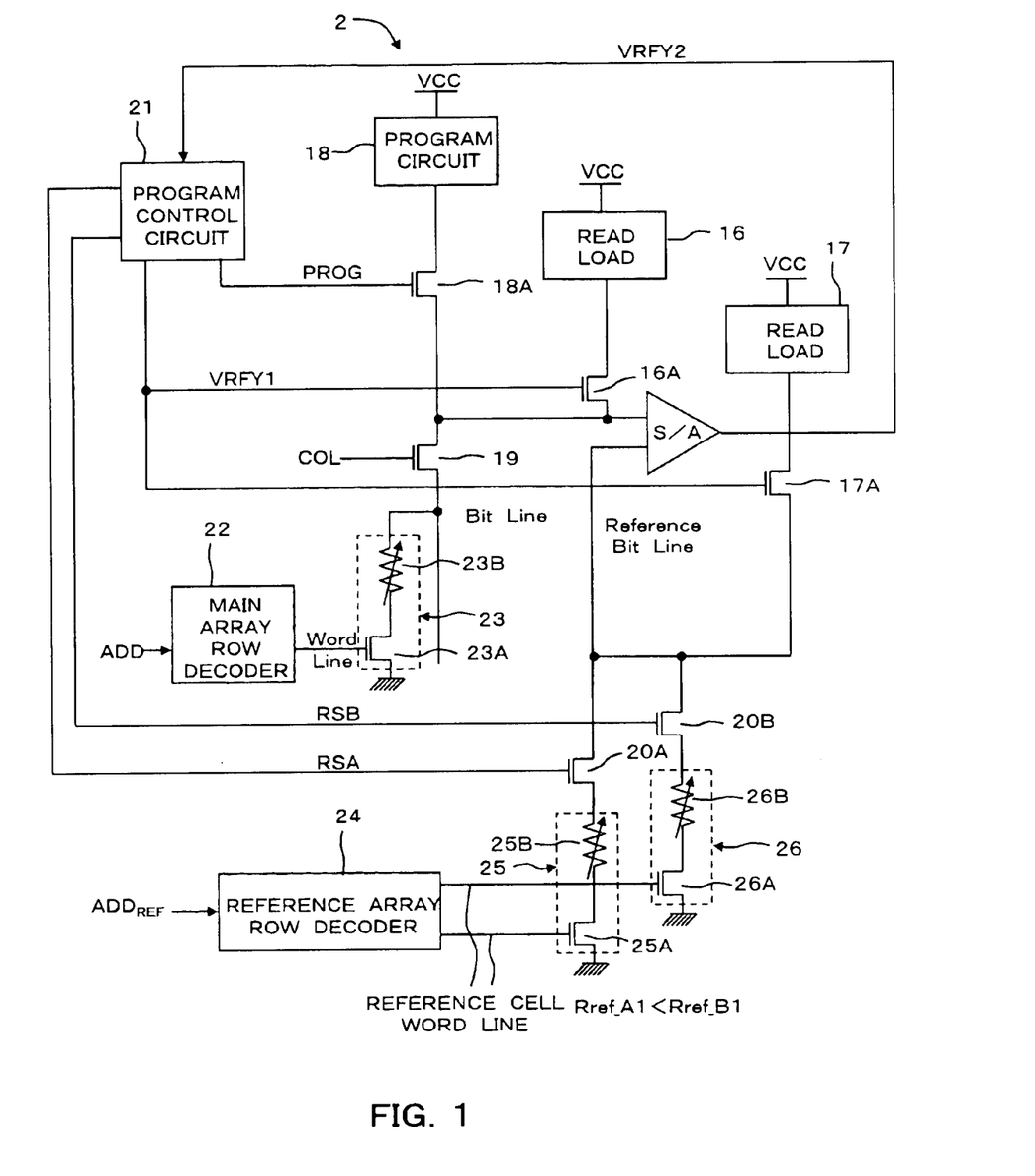
FIG. 1 is a circuit diagram showing example major configuration portions of a semiconductor memory device of an embodiment according to the present invention.
Figure 2:
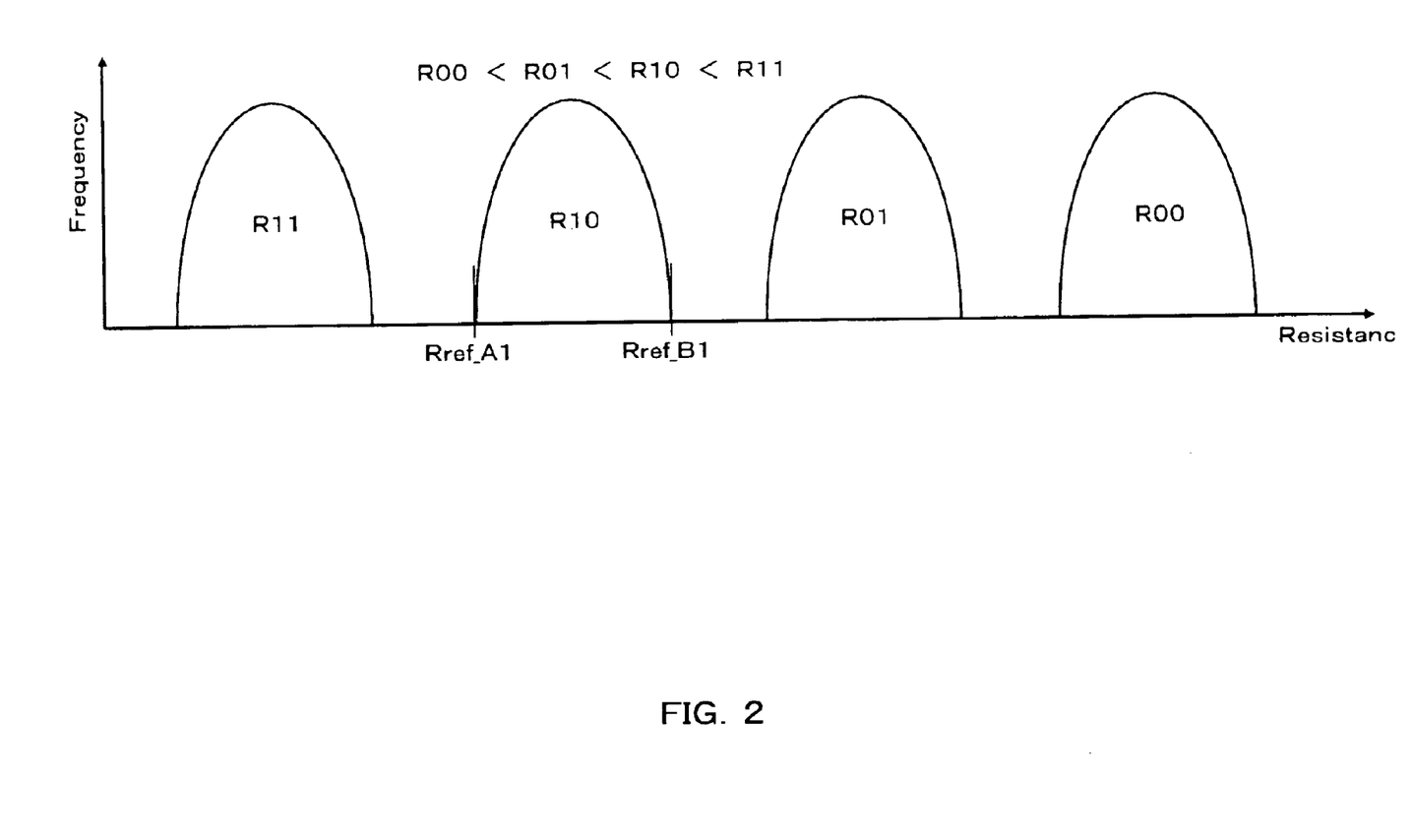
FIG. 2 is a diagram of a resistance distribution in a non-volatile resistance variation memory device when two bits (four levels) are stored into one cell.

FIG. 1 is a circuit diagram showing example major configuration portions of a semiconductor memory device 2 of the embodiment according to the invention. FIG. 2 is a diagram of a resistance distribution in a nonvolatile resistance variable memory device that stores two bits (four levels) are stored into one cell. In the drawings, the same or similar numerals/symbols represent circuit elements, circuit blocks, and signals having functions that are the same as or similar to those of the NOR flash memory device shown in FIG. 4; and duplicative descriptions are omitted herefrom.

Referring to FIG. 1, the semiconductor memory device 2 has a program control circuit 21; a main array row decoder 22; a plurality of main cells 23 (only one of which is shown); a reference cell row decoder 24; a first reference cell 25; a second reference cell 26; a determination-dedicated sense amplifier S/A; read loads 16 and 17; a program circuit 18; a switch devices 16A, 17A, 18A, 19, 20A, and 20B.

The main cell 23 is configured of a 1T1R memory cell, having a selection transistor 23A used as a switch device and a nonvolatile variable resistor element 23B. The resistor element 23B corresponds to the floating-gate transistor in which the resistance value is variable and the resistance value is variable corresponding to applied voltage. Although not shown in the drawing in detail, the plurality of main cells 23 are disposed in the row and column direction in the form of a matrix memory array (which hereinbelow will be referred to as "main array" depending on the case). Word lines are routed at predetermined intervals to extend along the row direction, and are coupled in units of the row to individual gates of the plurality of selection transistor 23A. A plurality of bit lines are routed along the column direction (perpendicular to the row direction) of the memory array, and are coupled in units of the column to individual one-ends of the plurality of nonvolatile variable resistor elements 23B. The each other end of the nonvolatile variable resistor element 23B is coupled to the drain or source of the each selection transistor.

In the nonvolatile variable resistor element 23B, a nonvolatile resistance variable memory device is configured with a thin film formed between electrodes. The thin film is formed of an oxide having a perovskite structure, such as $Pr_{0.7}Ca_{0.3}MnO_3$, containing manganese known as a ferroelectric material. The nonvolatile variable resistor element 23B may be coupled to either a forestage or backstage of the selection transistor 23A. More specifically, the main cell 23 may be configured such that the bit line is coupled to the drain or source of the selection transistor 23A, and the one end of the nonvolatile variable resistor element 23B is coupled to the source or drain of the selection transistor 23A.

The first reference cell 25 is configured of a reference resistor 25B, which is set to a referential minimum set resistance value Rref A1, and a reference selection transistor cell 25A. The reference cell 25 is used to determine whether a resistance state of the main cell 23 is higher than or equal to the minimum value Rref A1 of a resistance value distribution corresponding to a memory state (a memory state R10 in the present embodiment). The second reference cell 26 is configured of a reference resistor 26B, which is set to a referential maximum set resistance value Rref B1, and a reference selection transistor cell 26A. The reference cell 26 is used to determine whether the resistance state of the main cell 23 is lower than or equal to the maximum value Rref B1 of the resistance value distribution corresponding to a memory state (the memory state R10 in the present embodiment). The respective reference resistors 25B and 26B of the respective reference cells 25 and 26 are each configured of a same nonvolatile variable resistor element as the nonvolatile variable resistor element 23B of the main cell 23. However, these resistors 25B and 26B may each be a fixed resistor element in which the resistance is fixed.

The program control circuit 21 control and/or performs processing as described hereunder. For the execution of a verify operation, the program control circuit 21 outputs a verify execution signal VRFY1 to switch devices 16A and 17A. Concurrently, the program control circuit 21 outputs a reference-cell selection signal RSA (or RSB) to the reference cell 25 (or 26). In addition, in accordance with a verify determination signal VRFY2 received from the sense amplifier S/A, after the application of a program pulse from the program circuit 18 to a selected main cell 23, the processing executes a verify operation. Thereby, the processing determines whether the resistance value of the nonvolatile variable resistor element 23B is higher than or equal to the minimum set resistance value (Rref A1) of the reference cell 25. In the event of a programming operation, i.e., when the resistance value of the resistor element 23B is not higher than or equal to the value (Rref A1), the program control circuit 21 outputs a program execution signal PROG to the switch device 18A. At this event, as a voltage of a selected word line, a voltage as has been set as the verify voltage is fed also at the event of the programming operation.

Thus, the program control circuit 21 controls and/or performs processing as described hereunder. In accordance with the verify determination signal VRFY2 received from the sense amplifier S/A, the program pulse is applied from the program circuit 18 to the selected main cell 23, and the verify operation is then executed. Thereby, the processing determines whether the resistance value of the nonvolatile variable resistor element 23B is higher than or equal to the minimum set resistance value of reference resistance 25B (Rref A1) of the reference cell 25. If, as a result of the determination, the processing determines that the resistance value of the nonvolatile variable resistor element 23B is not higher than or equal to the minimum set resistance value of reference cell 25 (Rref A1), the processing returns to the step of programming (reprogramming). On the other hand, if the resistance value is higher than or equal to the minimum set resistance value of reference cell 25 (Rref A1), the processing switches from the reference-cell selection signal RSA to the reference-cell selection signal RSB. Thereby, the processing determines whether the resistance value of the nonvolatile variable resistor element 23B is lower than or equal to the maximum set resistance value Rref B1 of the reference resistor 26B of the reference cell 26. If, as a result of the determination, the resistance value of the nonvolatile variable resistor element 23B is lower than or equal to the maximum set resistance value (Rref B1) of the second reference cell 26 (reference resistor 26B), the processing executes a normal program termination. On the other hand, if the resistance value of the nonvolatile variable resistor element 23B is not lower than the maximum set resistance value Rref B1 of second reference cell 26, the processing executes a program abortive termination (failure).

In summary, the program control circuit 21 controls and/or performs processing as follows. The processing performs the verify operation by using the sense amplifier S/A (described below in more detail). Then, the processing determines whether the resistance value of the nonvolatile variable resistor element 23B of the selected main cell 23 is higher than or equal to the minimum resistance value of the reference resistor 25B of the first reference cell 25. If the resistance value of the resistor element 23B is higher than or equal to the minimum resistance value, the processing executes a normal program termination. If the resistance value of the resistor element 23B is not higher than or equal to the minimum resistance value, the program execution signal PROG is output to the switch device 18A.

The main array row decoder 22 decodes an input address signal ADD. Then, corresponding to a given address, the main array row decoder 22 outputs a same word line voltage (voltage of the same level as those of the verify voltage and programming voltage) to a to-be-selected main array word line, and selects a predetermined main cell 23. Similarly, a column decoder (not shown) decodes an input address signal ADD and outputs a column section signal COL to thereby select a predetermined to-be-selected bit line corresponding to a given address. Thus, the main array row decoder 22 and the column decoder (not shown) select a word line and a bit line, respectively, to thereby select the predetermined main cell 23 and a reference cell 25 or 26. While the configuration shown in FIG. 1 does not have a word line voltage generator of the type (word line voltage generator 12) as shown in FIG. 4, the configuration does not require the generator as long as it uses the same wordline voltage as the power supply voltage. In the case where a voltage other than the power supply voltage is used for the wordline voltage, the wordline voltage generator 12 needs to be provided. However, the embodiment of the invention is different from flash memories in that even in the case where the program operation and the verify operation need to be alternately iterated, the wordline voltage need not be varied corresponding to the program operation and the verify operation. Consequently, the circuit of the present embodiment can be implemented with a significantly simplified configuration.

The reference cell row decoder 24 is responsible of decoding an input reference address signal $ADD_{REF}$ to output a word line voltage (a verify voltage) to predetermined a reference-cell dedicated word line and then to select a predetermined reference cell 25 or reference cell 26.

When a verify operation is executed, the sense amplifier S/A performs a comparison and a determination whether the resistance value of the nonvolatile variable resistor element 23B is higher than or equal to the minimum set resistance value (Rref A1) of the reference cell 25. Then, the sense amplifier S/A outputs the verify determination signal VRFY2 as a resultant signal to the program control circuit 21. In addition, when the resistance value of the nonvolatile variable resistor element 23B is higher than or equal to the minimum set resistance value (Rref A1) of the reference cell 25, the sense amplifier S/A determines whether the resistance value of the resistor element 23B is lower than or equal to the maximum set resistance value (Rref B1). As a resultant signal of the determination, the sense amplifier S/A outputs a verify determination signal VRFY2 to the program control circuit 21.

While FIG. 1 shows only the two reference cells 25 and 26, other reference cells need to be provided corresponding to other individual memory states. In addition, according to the illustrated configuration, the reference cell row decoder 24 is used to enable the two reference cells 25 and 26 to be individually selected. However, since the columns (reference bit lines) are individually selectable by the reference-cell selection signals RSA and RSB, a word line may be provided to common for the two reference cells 25 and 26.

Figure 3:
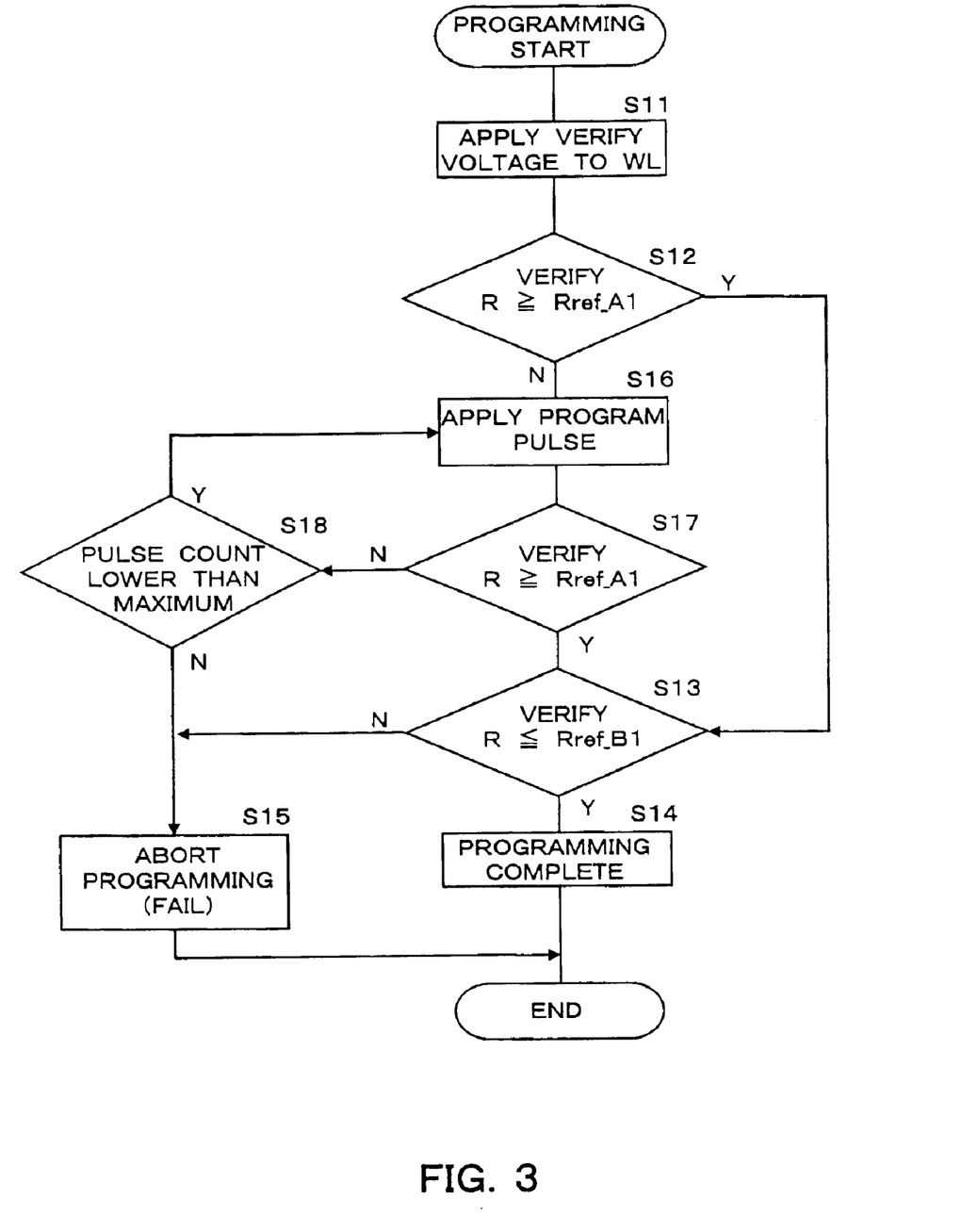
FIG. 3 is a flowchart showing program and verify operations in the semiconductor memory device of the invention.

Referring to FIG. 3, description will now be made hereunder regarding routines of program and verify operations to be performed in the semiconductor memory device 2 constructed as described above. More particularly, these routines will be described with reference to an exemplary case where the memory cell is programmed from a memory state R11 to a memory state R10.

FIG. 3 is a flowchart showing the program and verify operations to be performed in the semiconductor memory device 2 shown in FIG. 1. Hereinbelow, the verb "program" is defied to refer to "execute processing that increases the resistance value of the nonvolatile variable resistor element 23B." However, this definition is not limited thereby, and the definition may even be applied to the case of decreasing the resistance value without problems that affect the present invention.

First, in step S11, the word line voltage of a word line to be coupled to the gate of a selection transistor 23A of a to-be-programmed main cell 23 corresponding to a predetermined address is set to a verify voltage. At this event, the word line voltage is set to a high voltage sufficient to avoid the influence of an "on" resistance of the selection transistor 23A on a program operation. The influence can be substantially ignored with the application of a voltage of, for example, about 5 to 8. However, depending on the case, a voltage level equivalent to a level of the power supply voltage is sufficient to avoid the problem.

Subsequently, at step S12, the processing executes a verify operation, and the sense amplifier S/A outputs a verify determination signal VRFY2 to the program control circuit 21. The signal VRFY2 is used to determine whether the resistance value of the nonvolatile variable resistor element 23B is higher than or equal to the minimum set resistance value (Rref A1) of the first reference cell 25. In accordance with the signal VRFY2, the program control circuit 21 determines whether the resistance value of the nonvolatile variable resistor element 23B is higher than or equal to the resistance value (Rref A1) of the reference cell 25. For the verify operation, a voltage of about 1 V to 2 V is applied to two ends of the resistor element 23B for about 100 ns. The voltage to be applied to the two ends of the resistor element 23B is controlled to a level that does not cause read disturb. Generally, the voltage is controlled to a level lower than a level to be applied to the two ends of the resistor element 23B for the program operation.

Subsequently, in step S12 if the resistance value of the nonvolatile variable resistor element 23B is determined to be higher than or equal to the resistance value (Rref A1) (if the answer is "Yes"), the processing goes to step S13. In step S13, the processing then determines whether the resistance value of the resistor element 23B is lower than or equal to the maximum set resistance value (Rref B1). If the resistance value of the resistor element 23B is lower than or equal to the resistance value (Rref B1) (if the answer is "Yes"), in step S14 the processing executes a program termination process. On the other hand, however, if in step S13 the resistance value of the resistor element 23B is not lower than or equal to the resistance value Rref B1 (if the answer is "No"), in step S15 the processing executes a forced program termination.

In contrast, if in step S12 the resistance value of the nonvolatile variable resistor element 23B is not higher than or equal to the resistance value (Rref A1) of the reference cell 25 (if the answer is "NO"), the processing proceeds to the sequent processing of step S16. In step S16, the word line voltage is not altered, and a program pulse is applied to the main cell 23 (specifically, a voltage of about 5 V to 6 V is applied to two ends of the resistor element device for about 100 ns).

In step S17, the word line voltage is not altered from that in the application of the program pulse, and a verify operation is executed. As a results, the sense amplifier S/A outputs a verify determination signal VRFY2 to the program control circuit 21. The signal VRFY2 is used to determine whether the resistance value of the nonvolatile variable resistor element 23B is higher than or equal to the minimum set resistance value (Rref A1). In accordance with the signal VRFY2, the program control circuit 21 determines whether the resistance value of the resistor element 23B is higher than or equal to the resistance value (Rref A1).

In step S17, if the resistance value of the nonvolatile variable resistor element 23B is higher than or equal to the resistance value (Rref A1) (if the answer is "Yes"), the processing proceeds to the sequent processing of step S13. In step S13, the processing determines the resistance value of the resistor element 23B is lower than or equal to the maximum set resistance value (Rref B1). In step S13, if the resistance value of the resistor element 23B is lower than or equal to the resistance value (Rref B1) (if the answer is "Yes"), in step S14 the processing executes a normal program termination. On the other hand, however, in step S13 the resistance value of the resistor element 23B is not lower than or equal to the resistance value Rref B1 (if the answer is "No"), in step S15 the processing executes a forced program termination process (causes program failure).

In step S17, if the resistance value of the nonvolatile variable resistor element 23B is not higher than or equal to the resistance value (Rref A1) (if the answer is "No"), the processing proceeds to step S18. In step S18, the processing counts the number of executions (execution counts) of the program-pulse application routine. If the count value is less than the value of a preset maximum set count (if the answer is "Yes"), the processing returns to the process of step S16. On the other hand, if the count value has found not to be less than the value of the preset maximum set count, that is, the count value has reached the value of the preset maximum set count (if the answer is "No"), the processing executes a forced program termination process (causes program failure). The process of step S18 is performed to prevent the program routine to enter an endless loop when the selected main cell 23A cannot be programmed or cannot easily be programmed for some reasons.

In the case of a binary memory, no problems occur even without performing step S11 and step S12 for the verify operation. However, in the case of a multi-level memory, steps S11 and S12 for the verify operation are indispensable to prevent a state variation from being caused by over-programming. If steps S11 and S12 for the verify operation are omitted, the word line voltage needs to be set to the programming voltage prior to the application of the program pulse. However, execution of step S11 enables the operation without causing a problem. Further, step S13 to determine whether the input resistance value is higher than or equal to the referential maximum set resistance value is not required in the case of the binary memory.

Thus, the embodiment has been described with reference to the example case. That is, the values of currents flowing to the predetermined main cell 23 and the reference cell 25 or 26 that are selected by selecting a word line and a bit line corresponding to an input address are compared by the sense amplifier S/A to thereby implement at least a verify operation of two verify and program operations set to be mutually related front and rear steps. In this case, the main cell 23 is configured as a serial circuit with the selection transistor 23A and the nonvolatile variable resistor element 23B in which the resistance state is variable depending on the applied voltage. In addition, the voltage to be applied to the word line (word line voltage) of the main cell 23 is set to the same voltage in the verify operation and the program operation. Accordingly, the program processing speed is improved corresponding to the fact that the word line voltage is not altered depending on the verify operation or the program operation. In addition, the chip area is reduced corresponding to the fact that the word line voltage generator and the control circuit can be omitted or simplified. Further, the omission or simplification of those circuits enables the operation current for those circuits to be eliminated from the chip operation current for the program operation. Consequently, the current for the program operation can be reduced.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
   a memory cell formed of a nonvolatile resistance variable memory device in which a resistance value is variable according to the application of electrical stress, and a selection transistor; and
   word-line-voltage feeding means that feeds a word line voltage to a word line to be coupled to the memory cell, wherein the word-line-voltage feeding means feeds the word line voltage of the same voltage level to the word line to be coupled to the memory cell selected as a program target for two operations set as mutually related front and rear steps, namely, a program operation to be executed for the memory cell and a verify operation to be executed to verify a program state of the memory cell.

2. The semiconductor memory device according to claim 1, wherein:
- a plurality of the memory cells are arranged individually in a row direction and a column direction to form a memory cell array;
- the memory cell area has a plurality of the work lines and a plurality of bit lines;
- the word lines are commonly coupled to the plurality of memory cells along the row direction; and
- the bit lines are commonly coupled to the plurality of memory cells along the column direction.

3. The semiconductor memory device according to claim 2, wherein:
- the memory cell is constructed of a serial circuit formed of the nonvolatile resistance variable memory device and the selection transistor;
- the word line is coupled to a gate of the selection transistor; and
- the bit line is coupled to one end of the serial circuit.

4. The semiconductor memory device according to claim 2, wherein the verify operation is executed by comparing values of currents flowing to the memory cell and a reference cell, the memory cell being coupled to the word line and the bit line that are selected corresponding to an input address.

5. The semiconductor memory device according to claim 3, wherein the program operation is executed such that:
- using the word line voltage applied to the word line selected corresponding to the input address, the selection transistor in the memory cell selected as the program target is switched to an on-state; and
- a program pulse is then applied to the nonvolatile resistance variable memory device of the memory cell selected as the program target, via the bit line selected corresponding to the input address.

6. The semiconductor memory device according to claim 5, wherein the nonvolatile resistance variable memory device becomes capable of storing multi-level data in the manner that the resistance state thereof is altered corresponding to the state of application of the program pulse.

7. A control method of the semiconductor memory device as defined in any one of claims 1 to 6, comprising:
- selecting the word line that is to be coupled to the memory cell selected as the program target, corresponding to an input address;
- setting the word line voltage to a verify voltage for the selected word line;
- subsequently executing the verify operation; and
- executing the program operation in continuation to the verify operation without altering the word line voltage.

8. The control method of the semiconductor memory device according to claim 7, wherein a verify operation is executed in continuation to the program operation without altering the program operation.

9. A control method of the semiconductor memory device as defined in any one of claims 1 to 6, comprising:
- selecting the word line that is to be coupled to the memory cell selected as the program target, corresponding to an input address;
- setting the word line voltage to a verify voltage for the selected word line;
- subsequently executing the program operation; and
- executing the verify operation in continuation to the program operation without altering the word line voltage.

* * * * *